United States Patent [19]
Ballard

[11] Patent Number: 4,529,621
[45] Date of Patent: Jul. 16, 1985

[54] PROCESS FOR DEPOSITING A THIN-FILM LAYER OF MAGNETIC MATERIAL ONTO AN INSULATIVE DIELECTRIC LAYER OF A SEMICONDUCTOR SUBSTRATE

[75] Inventor: Delbert L. Ballard, Northridge, Calif.

[73] Assignee: Utah Computer Industries, Inc., Salt Lake City, Utah

[21] Appl. No.: 539,729

[22] Filed: Oct. 5, 1983

[51] Int. Cl.[3] .................... H01L 21/316; H01L 21/94
[52] U.S. Cl. ................................ 427/95; 204/192 M; 365/171; 427/94; 427/96; 427/99; 427/131
[58] Field of Search ............... 204/192 M; 427/94-96, 427/91, 99, 131; 365/171

[56] References Cited

U.S. PATENT DOCUMENTS

| | | | |
|---|---|---|---|
| 3,161,946 | 12/1964 | Birkenbeil | 204/192 M |
| 3,573,485 | 4/1971 | Ballard | 307/406 |
| 3,702,991 | 11/1972 | Bate et al. | 340/174 TF |
| 3,800,193 | 3/1974 | Ashar et al. | 317/235 R |
| 4,149,301 | 4/1979 | Cook | 29/25.42 |

OTHER PUBLICATIONS

Petersen, "Thin Film Magnetic Heads," IBM TDB, vol. 21, No. 12, May 1979, p. 5002.
Ahn, "NiFe Films Mixed with $SiO_2$ for Improved Adhesion," IBM TDB, vol. 18, No. 10, Mar. 1976, p. 3523.
C. Morosanu et al., "Thin Film Preparation by Plasma and Low Pressure CVD in a Horizontal Reactor," 31 Vacuum, 309-313, No. 7 (1981).

*Primary Examiner*—John D. Smith
*Attorney, Agent, or Firm*—Workman, Nydegger & Jensen

[57] ABSTRACT

The present invention is directed to a process for depositing a thin-film layer of magnetic material onto an insulative dielectric layer of a semiconductor substrate such that the layer of magnetic material completely and permanently adheres to the insulative dielectric layer. A product within the scope of the present invention is prepared by taking a semiconductor substrate, such as a silicon wafer, and through a chemical-vapor deposition process depositing a layer of an insulative dielectric (such as the silicon dioxide or silicon nitride) on the layer, and subsequently depositing a layer of a magnetic material (such as a nickel-iron alloy or a manganese-bismuth alloy) through a sputtering process onto the insulative dielectric layer.

11 Claims, 5 Drawing Figures

PROCESS FOR DEPOSITING A THIN-FILM LAYER OF MAGNETIC MATERIAL ONTO AN INSULATIVE DIELECTRIC LAYER OF A SEMICONDUCTOR SUBSTRATE

BACKGROUND

1. Field of the Invention

This invention relates to integrated circuit fabrication process, and, more particularly, to a process for depositing a thin-film layer of magnetic material onto an insulative dielectric layer of a semiconductor substrate.

2. The Prior State of the Art, and Principal Objects of This Invention

An integrated circuit ("IC") consists of a series of discrete circuit elements which may either be active elements such as transistors or diodes, or passive elements such as resistors or capacitors, which are fabricated in place as an integral part of a semiconductor substrate. Most often the substrate is a silicon "wafer", although germanium and some other types of semiconductive materials have also been used.

Each wafer typically has numerous individual integrated circuits formed on it. Transistors, which are the basic active integrated circuit elements, may be either bipolar, (that is, a transistor which depends on the properties of two types of charge carriers, namely, electrons or "n" type carries and holes or "p" type carriers, for its operation) or unipolar, (that is, one which depends on only one type of charge carrier). Bipolar transistors consist of base, collector and emitter regions formed on a selected layer of the substrate by doping the regions with certain chemical impurities which provide the desired type of charge carriers. Similarly, unipolar transistors consist of gate, source and drain regions formed on a selected layer of the substrate. Typical impurities which can be diffused in silicon to provide "n" or "p" type carrier regions include antimony (n type), arsenic (n type), phosphorus (n type), boron (p type), gallium (p type) and aluminum (p type).

As hereinafter more fully explained, the numerous individual circuit elements of each integrated circuit are formed on the semiconductor substrate using what is commonly called a planar process. Briefly summarized, the planar process consists of forming a passivation layer of oxide or other suitable material on top of the silicon wafer, which is then photolithographically patterned to permit selective introduction of "n" or "p" type impurities into the bulk of the silicon wafer at selected regions, thus altering the electrical properties of those regions. A series of three such selective introductions is required to form isolated bipolar transistors, whereas only one is required for unipolar transistors.

Since the introduction of the concept of semiconductor integrated circuits by Jack Kilby in the late 1950's, and with the development at about this same time of the planar process for making diffused transistors by Robert Noyce and Gordon Moore, semiconductor integrated circuit technology has played an increasingly important role in our society. One of the most fundamental and important applications of semiconductor integrated circuits has been their use in constructing computer memories, and one need only look at the growth of the computer industry to appreciate the degree to which our lives are now affected by this technology.

Prior to the introduction in 1970 of the 1-kilobit, fully decoded random access memory ("RAM"), passive, ferromagnetic storage cells were used as the basic means of storing information in digital computers. This type of storage cell has the inherent advantage of compact construction and lack of power consumption. Even today, passive ferromagnetic-type storage cells are typically preferred in certain types of military applications because they are nonvolatile—that is to say, the information stored in such a cell is not lost in the event of exposure to radiation or temporary loss of power. However, passive ferromagnetic-type storage cells also have a certain disadvantage in that readout of information is destructive since it is erased from the cell during the readout process. A further disadvantage is that the cell provides a very low output signal which must be amplified for proper utilization.

Some designs have been developed so that by using additional electronic circuitry, a "write-after-read" operation can be performed in which the information otherwise erased from the storage cell is immediately written back into the cell after the readout process. However, the use of such electronic circuits increases cost and creates further diminution of the output signal, thus increasing the amplification problem which is already inherent by virtue of the low output signal provided by this type of storage cell.

With the advent and improvement of low cost, high yield manufacturing processes for semiconductor integrated circuits, the cost per bit of semiconductor computer memories has steadily decreased over the last decade. Thus, increasingly the type of cell used to store digital information is derived from the use of active electronic elements arranged on semiconductor ICs in a conventional flip-flop (i.e., cross-coupled transistor) configuration. Active electronic storage cells can be designed using either unipolar or bipolar transistors, which are typically manufactured at a relatively low cost on large or very large scale semiconductor integrated circuits.

These semiconductor or active flip-flop type storage cells have the advantage that readout is nondestructive and the output signal is higher than that of the passive, ferromagnetic-type storage cell. However, an inherent disadvantage is that power is continuously dissipated by the transistor elements, which creates undesirable heating effects. Furthermore, the stored digital information is lost if there is a power failure, even if the power loss is only momentary. The digital information stored in an active storage cell can also be destroyed by high density ionizing radiation and is thus not suitable for those types of applications which require nonvolatile storage.

More recently, it has been proposed to combine the inherent advantages of both passive and active storage elements (i.e., low power consumption and nonvolatility of the ferromagnetic-type storage cell with the nondestructive readout and high signal output of an active flip flop configuration). See, e.g., U.S. Pat. No. 3,573,485 issued Apr. 6, 1971 to Delbert L. Ballard. In this type of combination semiconductor/magnetic storage cell, a circuit is formed using a pair of cross-coupled electronic switching elements such as bipolar or unipolar transistors. Connected with at least one of these active switching elements as an impedance coupler is a passive (i.e., ferromagnetic) storage element. Digital information which is to be stored in the cell is electromagnetically written into the ferromagnetic storage element, thereby changing its effective impedance in the circuit. The readout signal is obtained from the electronic switching elements by providing power to the switching elements in response to a readout address signal, with the electronic switching elements then assuming a conductive or nonconductive state which is determined by the effective circuit impedance provided by the ferromagnetic storage element.

Notwithstanding the inherent advantages of a semiconductor/magnetic-type storage cell, it has been necessary to overcome a number of very difficult practical problems in order to manufacture the passive ferromagnetic element of this type of storage cell as an integrated component of a semiconductive integrated circuit. A principal problem which has been an impediment in this area has been the difficulty in developing a workable process for permanently depositing a thin-film ferromagnetic or magnetic alloy layer into an insulative dielectric layer of a semiconductor substrate.

It is therefore a primary object of the present invention to overcome the problems of the prior state of the art by providing a workable process for depositing a layer of ferromagnetic or magnetic alloy material onto an insulative dielectric layer such that the layer of magnetic material will completely and permanently adhere to the insulative dielectric layer.

Another important object of the present invention is to provide a novel product which includes a thin-film layer of magnetic material deposited so as to completely and permanently adhere to a layer of insulative dielectric material formed on a semiconductor substrate.

The foregoing and other objects and features of the present invention will become more fully apparent from the following description and appended claims, taken in conjunction with the following drawings.

BRIEF SUMMARY OF THE INVENTION

In accordance with the foregoing principal objects, the present invention provides for a novel manufacturing process which may be used, among other things, in producing a semiconductor/magnetic storage cell having a thin-film layer of magnetic material formed as an integrated component of a semiconductor substrate. The process begins with preparation of a substrate such as a silicon wafer. The silicon wafer is processed so as to form the necessary circuit elements such as transistors, diodes, resistors, capacitors or the like which, when interconnected, form the individual integrated circuits of the wafer. A layer of insulative dielectric material is deposited onto the wafer using a chemical-vapor deposition process which consists of heat-induced decomposition of selected gases. The insulative dielectric layer may typically consist of silicon dioxide or silicon nitride, depending upon the particular gases and chemical reaction selected. A thin-film layer of magnetic material such as a nickel-iron or manganese-bismuth alloy is then deposited onto the layer of insulative dielectric material using a sputtering process. The resultant thin-film layer of magnetic material will completely and permanently adhere to the layer of insulative dielectric material.

BRIEF DESCRIPTION OF THE DRAWINGS

Reference is next made to the drawings, in which like parts are designated with like numerals throughout, and in which.

Figure 1:
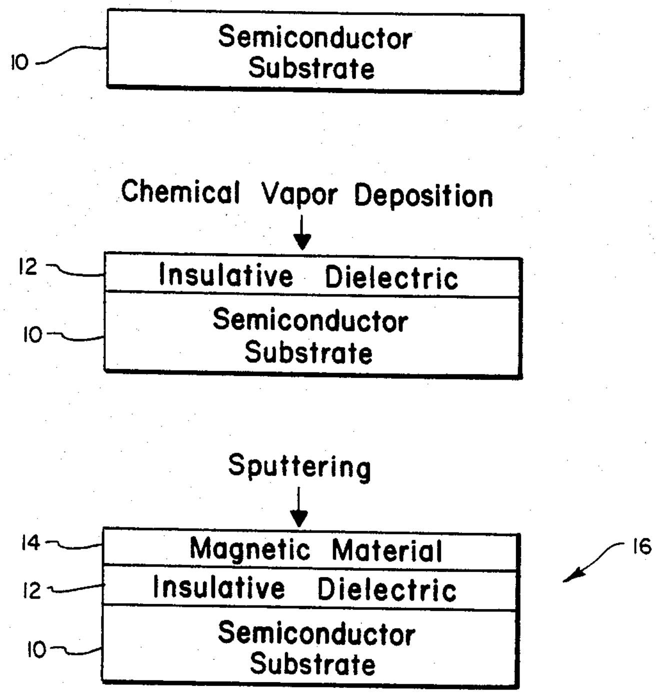
FIG. 1 is a schematic diagram which generally illustrates the process of the present invention.

Reference is next made to a detailed description of the presently preferred embodiments of the invention as illustrated in the drawings.

DETAILED DESCRIPTION OF THE PRESENTLY PREFERRED EMBODIMENTS

The following detailed description begins with an overview of a manufacturing process for producing integrated circuits using a planar process. The discussion then turns to a more detailed description of the way in which the process of the present invention is used in conjunction with such a planar process.

A. General Overview

The manufacturing process begins with preparation of raw semiconductive material (usually silicon) into a suitable substrate which is formed as a small disc or wafer. The first step in producing a silicon wafer is purifying raw silicon. This may be done by "zone refining" in which a molten zone is passed through a graphite "boat" which contains the starting material. The result is separation and removal of impurities, leaving behind a chemically purified polycrystalline silicon material. The purified raw material is next converted into a single-crystal ingot. The ingot is grown by placing a single-crystal seed on the end of a shaft and rotating the shaft slowly through and away from the molten silicon. The melting and refreezing of the silicon at the seed interface allows crystal formation to take place. The cylindrical ingot is grown by slowly withdrawing the seed from the melt, with the critical parameters in the single-crystal growth process being rotation and withdrawal rate of the seed, and purity and temperature uniformity of the melt.

After the crystal growth is completed, the ingot is ground on one side to produce a "flat" that parallels the growth axis. The flat is used as a reference point for alignment of wafers during imaging and the like. After the flat is produced, the ingot is sliced using diamond saws into wafers which are typically twenty to forty mils thick, and approximately 7.6 cm in diameter. Sliced wafers are then lapped to remove damage or irregularities caused by the slicing. Each wafer is then polished and chemically etched, leaving a highly polished, damage-free surface.

Once the silicon wafers are completed they are processed in batches and are repetitively subjected to imaging processes, to deposition and growth processes and to etching-masking processes. As described further below, each of these processes are complicated procedures which can be combined and performed in an almost unlimited variety of ways.

1. Imaging Processes

Imaging processes are used to replicate patterned geometries on the wafer surface which represent the particular integrated circuit configuration (i.e., interconnection of circuit elements) to be produced on each "chip" of the wafer. Imaging begins with either a chemical or mechanical pretreatment of the wafers to remove dust and other forms of airborne or human contamination. Pretreatment of the wafers may also include application of a resist adhesion promoter to enhance adhesion of a photoresist which is applied to the wafers. Pretreatment is followed by coating the wafers with a photoresist, which is then subjected to infrared, conduction or microwave heating (call "softbaking") in order to render the photoresist sensitive to exposure energy.

Using a photomask, the wafers are exposed by either blanket exposure, step-and-repeat exposure, or scanning using a beam of exposing energy. This exposure produces a latent image closely matching the pattern of the photomask. Next, the wafers are sprayed with a developer solution for a predetermined time in order to permit the solution to selectively attack and remove either exposed regions (in the case of a positive photoresist) or unexposed regions (in the case of a negative photoresist). The result is that a geometric pattern or "image" is left behind; this image serves as a mask for etching or for subsequent application of selected metals to be used as the interconnecting wiring pattern between circuit elements.

The wafers may then be subjected to postbaking in order to insure that the photoresist is adequately bonded. Postbaking is accomplished in the same manner as softbaking. The wafers are then etched using either wet or dry etching techniques in order to completely remove selected regions of a deposited oxide layer which are left exposed after the developing process.

Once etching is completed, the photoresist is removed by immersing the wafers in a heated resist-stripping solution or by placing them in a plasma-stripping chamber, where an oxygen plasma removes the resist. The surface of the wafers are then completely free of any photoresist material and the wafers are ready for ion implantation or diffusion, after which another thin layer of oxide is generally deposited or grown over the wafer and the entire cycle is repeated.

2. Deposition and Growth Processes

Deposition and growth processes are used to apply various layers of semiconductive or passivation materials to the wafer in order to selectively modify and/or insulate the electrical characteristics of various regions in the wafer for the purpose of forming the desired circuit components such as transistors, diodes, resistors, or capacitors.

Like imaging processes, deposition and growth processes can be performed in a wide variety of ways. For example, layers of iron oxide or other suitable passivation materials may be formed using certain oxidation or deposition processes. Such layers of passivation materials provide a base for photoresist adhesion and imaging, and/or provide an insulating layer between various other layers which contain circuit elements or interconnecting wiring patterns. Deposition and growth processes may include processes such as epitaxial growth, wherein a single-crystal material is applied to a silicon wafer of the same crystal orientation so as to grow a semiconductive layer which is used to provide the base and collector regions for bipolar transistors.

Regions of the various semiconductor layers may then be defined by masking and etching, and then doping the layers with chemical impurities (as described above) using diffusion or ion implantation techniques in order to generate p-n junctions which form active semiconductor devices such as diodes or transistors.

Finally, various types of processes (called "metallization") can be used to produce the interconnecting wiring pattern between the various circuit elements which form the integrated circuit. Wiring patterns can be formed on the wafer using flash evaporation, filament evaporation, electron-beam evaporation, planar and cylindrical sputtering, or induction evaporation methods.

3. Etching-Masking Processes

The etching-masking processes result in selective removal or addition of the deposited or grown layers of semiconductive or passivation materials in accordance with the patterned geometry which defines the integrated circuit elements. The etching-masking steps can be accomplished in a variety of ways, depending upon the particular type of material that is to be masked or etched. Materials commonly used in the etching-masking steps are silicon dioxide, doped silicon dioxide, polysilicon, silicon nitride, metals and polyimide.

The result of these highly complex imaging, deposition and growth, and etching-masking processes is the transformation of each substrate into a large number of integrated circuits which may contain literally tens or hundreds of thousands of individual circuit elements. Once these processes are completed, each wafer is scribed and diced so as to separate it into individual integrated circuits or chips, to which wire leads are then bonded prior to final encapsulation and packaging.

B. The Preferred Processes and Products

From the foregoing overview, it is readily apparent that an almost infinite variety of combinations of steps can be used to accomplish the basic steps of imaging, deposition and growth, and etching-masking, which are used to manufacture a particular integrated circuit configuration.

The process of the present invention is intended to be used as a part of the type of overall planar process described above. However, while the process of the present invention is particularly useful in producing a special type of semiconductor/magnetic storage cell in which a thin-film ferromagnetic element is formed as an integrated component of the semiconductor substrate, those of skill in the art will readily appreciate that the process of the present invention can be used in conjunction with a very wide variety of integrated circuit fabrication processes which could be used for producing other types of integrated circuit configurations.

In its simplest form, the process of the present invention may be generally described and illustrated with reference to FIG. 1. As shown in FIG. 1, a semiconductor substrate 10 is typically prepared in the form of a wafer from a suitable semiconductive material; silicon is the most commonly used material for the wafer.

After the wafer 10 has been subjected to appropriate imaging, deposition and growth, and etching-masking processes so as to form the basic transistor elements for each integrated circuit of the wafer, the wafer is subjected to a chemical-vapor deposition process so as to form an insulative dielectric layer 12 on the wafer 10 by means of heat-induced decomposition of selected gases. The insulative dielectric layer 12 may typically comprise silicon dioxide, silicon nitride, or any other suitable insulative dielectric material which can be deposited by chemical-vapor deposition.

Figure 2:
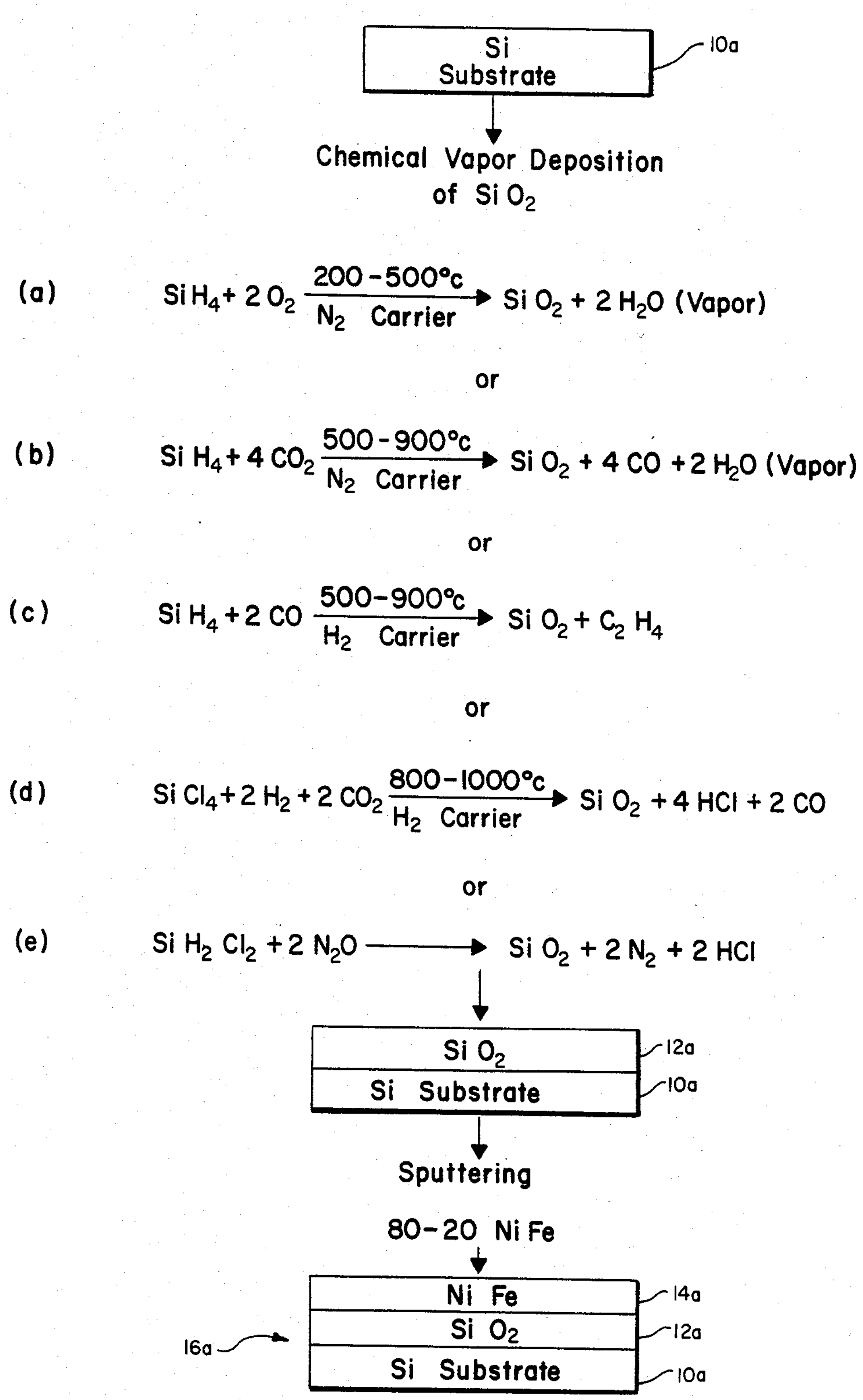
FIG. 2 is a schematic diagram which illustrates several alternative methods of producing one presently preferred embodiment of the product manufactured in accordance with the process of the present invention.

One method for chemical-vapor deposition of insulative layer 12a of silicon dioxide is to react silane ($SiH_4$) and oxygen ($O_2$) according to the reaction set forth in equation (a) of FIG. 2. In order to obtain the most desirable growth rate of silicon dioxide layer 12a which has a sufficiently high quality and which is of a relatively uniform thickness, the wafers are preferably heated to a temperature in the range of about 350° C. to about 500° C. during the vapor-deposition reaction of equation (a).

While it will be appreciated that temperatures outside the indicated range may be utilized, these temperatures have been found to be the most effective under practical manufacturing conditions. This is because the growth rate of the deposited layer of silicon dioxide peaks at about 400° C. and then falls off relatively rapidly as the temperature gets significantly hotter or colder. Hence, when the vapor deposition reaction of equation (a) is used, the wafers are most preferably heated to a temperature in the range of about 400° C. to about 410° C. Within the temperature range of from about 400° C. to about 410° C., the growth rate of deposited silicon dioxide layer 12a is about one thousand angstroms (1000 Å) per minute.

As mentioned above, typical reaction rates can be controlled to result in the deposition of silicon dioxide at a rate as high as a thousand angstroms a minute. Maximizing this deposition rate is advantageous in a commercial manufacturing setting, provided that the necessary high quality and uniformity can be maintained. Of course, under certain circumstances, it will be appreciated that greater uniformity may be necessary; hence, lower deposition rates may be desirable.

The thickness of the silicon dioxide layer will vary depending upon the specific application. For space considerations, it is usually desirable to have this silicon dioxide layer as thin as possible; however, if the layer is too thin, it may crack or be unable to fully insulate the adjacent layers. When the silicon dioxide layer is less than about 2000 Å, cracking of the layer is not uncommon. Thus, it is contemplated that under most circumstances, the silicon dioxide layer will be allowed to grow to a thickness of between about 2,000 and about 10,000 angstroms in thickness with the presently preferred thickness being between about 8000 Å and about 10,000 Å.

In order to obtain greater uniformity in the thickness of the silicon dioxide layer 12a which is produced according to reaction (a) of FIG. 2, the silane, which may be in a nitrogen carrier gas, is preferably not allowed to mix with oxygen until it is in the vicinity of the heated wafers. Since the uniformity of layer 12a is controlled by the reaction temperature, it is desirable to have the reaction take place on the wafer when it has been completely heated to the desired temperature.

In addition, greater uniformity in the silicon dioxide layer can be achieved and cracking can be minimized by phosphorus doping of the silicon dioxide. By adding trace amounts of phosphorus according to procedures known in the art, the silicon dioxide layer can be thinner and yet provide satisfactory insulation.

The presently preferred reaction for depositing dioxide layer 12a is set forth in equation (a) of FIG. 2. There are, however, other chemical reactions which could be utilized within the scope of the present invention in order to provide for chemical-vapor deposition of a satisfactory silicon dioxide layer. Through this reaction mechanism, a layer of silicon dioxide may be deposited onto a prepared silicon wafer.

According to the reaction of equation (b) of FIG. 2, silane is reacted with carbon dioxide, in the presence of nitrogen, at a temperature of between about 500° C. and about 900° C. Through this reaction mechanism, a layer of silicon dioxide may be deposited onto a prepared silicon wafer.

According to the reaction of equation (c) of FIG. 2, silane may be reacted with carbon monoxide in the presence of hydrogen gas at a temperature of between about 500° C. and 900° C. in order to produce the desired silicon dioxide layer, according to the reaction of equation (d) of FIG. 2. Alternatively, silicon chloride ($SiCl_4$) may be reacted with carbon dioxide in the presence of hydrogen gas at a temperature of between 800° C. and about 1000° C. in order to produce the silicon dioxide layer, according to the reaction of equation (d) of FIG. 2. Finally, silicon dioxide layer 12a may be produced according to the reaction of equation (e) of FIG. 2 in which dichlorosilane ($SiH_2Cl_2$) is reacted in the presence of nitrous oxide ($N_2O$).

Various types of reaction chambers may be used to carry out the process for chemical vapor deposition of the silicon dioxide layer. In typical reaction chambers, a susceptor (with silicon wafers placed on its surface) is rotated or otherwise moved in the gas environment to provide uniformity during the deposition process. The reaction chamber can comprise a standard bell-jar type of chamber, where the gas is pumped up through the susceptor; alternatively, the reaction chamber may comprise a horizontal system in which the gas is passed from one end of the chamber to the other. Barrel systems, in which wafers are placed on a rotating cylinder, have also been devised.

The heat sources which provide the deposition temperature are generally one of two types, either cold-wall or hot-wall. A typical cold-wall system uses ultraviolet or radio-frequency energy to heat the susceptor, which in turn heats the wafers by conduction. In a cold-wall system, the walls of the reaction chamber are at a lower temperature than those of hot-wall chambers, in which thermal-resistance heating is used.

In a hot wall machine, the entire reaction chamber is heated; hence, the walls of the machines are equally hot. Hot wall machines have the advantage of providing greater uniformity in the thickness of the insulative layer which is produced; however, they are typically more expensive and have a less throughput. Hence, it is typical, in the absence of a need for high uniformity of the layer, to use a cold wall apparatus.

Figure 4:
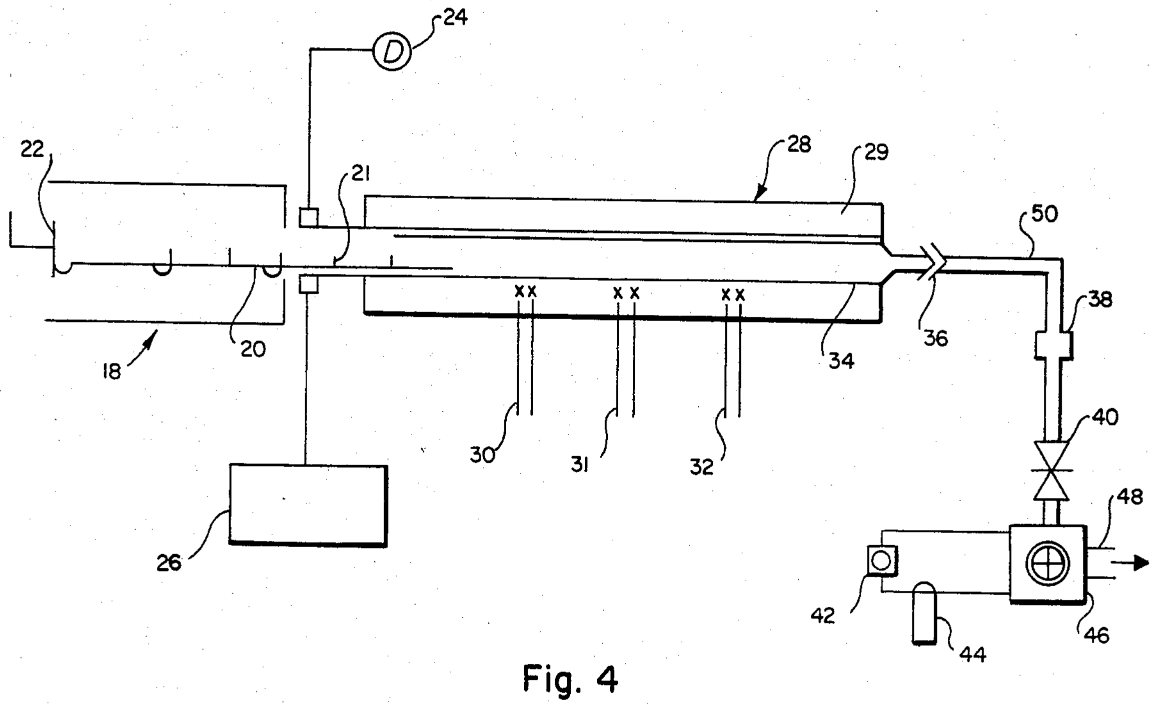
FIG. 4 is a schematic diagram of an apparatus which may be used to accomplish heat-induced decomposition of selected gases in accordance with the process of the present invention.

An example of such a cold-wall apparatus which can be used to accomplish low temperature chemical vapor deposition of the silicon dioxide is schematically illustrated in FIG. 4. The apparatus of FIG. 4 includes an automatic load station generally designated at 18 in which a "boat" 20 is loaded with the wafers 21. The end of the automatic load station 18 is sealed with a sealing plate 22, and the boat 20 containing the wafers 21 is then inserted into a long, horizontal quartz tube 34. The selected gases (for example, silane and oxygen in a nitrogen carrier gas) are then injected by means of a flow-controlled gas system 26 into the reaction chamber generally designated at 28, which includes a resistance-heated furnace 29.

Spike thermocouples schematically illustrated at 30–32 are used to monitor temperature, and a pressure sensor 24 is used to monitor pressure. An in-tube thermocouple 36 is typically inserted in exhaust tube 50, through which the undesired gaseous byproducts pass after the reaction is completed. Exhaust tube 50 is coupled to a trap 38 and a control valve 40, and to an exhaust system which includes a fan 46, an oil pump 42, and a filter 44. The exhaust gases exit through port 48.

A cold-wall vapor deposition apparatus which is suitable for use in the present invention and which is substantially similar to the apparatus illustrated in FIG. 4, is manufactured by Lindberg-Tempress, and is sometimes referred to as a Pyrox machine. White Crystal Science manufactures a hot wall reaction chamber of the diffusion tube type which can be used in accordance with the present invention.

Figure 3:
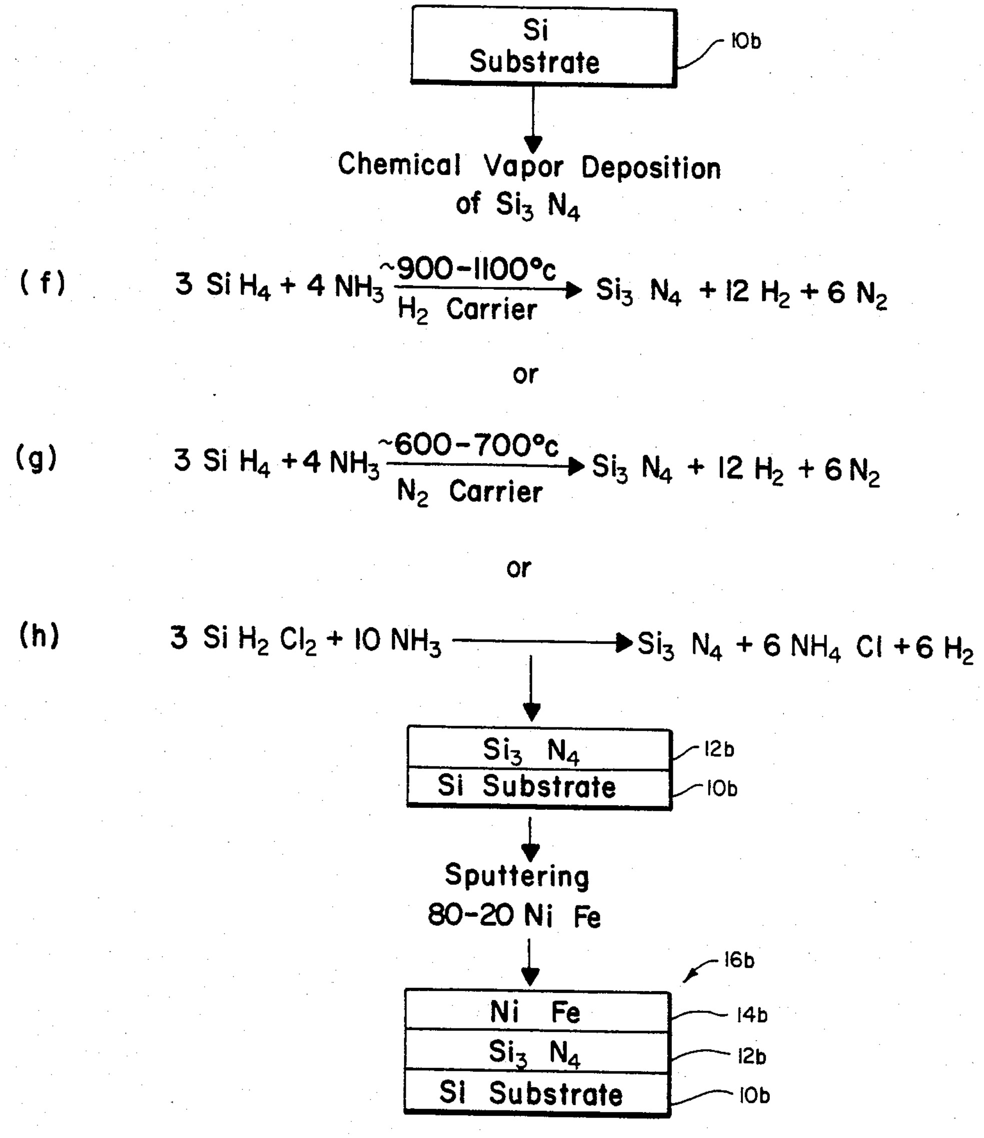
FIG. 3 is a schematic diagram which illustrates several alternative methods of producing a second presently preferred embodiment of the product manufactured in accordance with the process of the present invention.

As illustrated in FIG. 3, insulative dielectric layer 12 may be comprised of silicon nitride. In this embodiment, a layer **12*b* (see FIG. 3) of silicon nitride can be deposited using any of the same types of apparatus as are used in the case of depositing a layer of silicon dioxide. The only substantial difference is that different chemical reactants and reaction conditions are employed, as set forth in reaction equations (f) through (h) of FIG. 3**.

According to the reaction of equation (f), silane is reacted with ammonia in the presence of hydrogen at a temperature of from about 900° C. to about 1100° C. in order to produce the silicon nitride layer. Alternatively, by using the reaction of equation (g), the silicon nitride layer can be produced by reacting silane with ammonia in the presence of nitrogen at a temperature of from about 600° C. to 700° C. Finally, dichlorosilane ($SiH_2Cl_2$) may be reacted with ammonia in order to produce the desired silicon nitride layer, as set forth in equation (h) of FIG. 3.

Although silicon dioxide is generally the preferred material for insulative dielectric layer 12, it will be appreciated that under certain circumstances silicon nitride may be desirable. Silicon nitride is particularly useful when a high quality passivation layer is desirable. The silicon nitride prevents gases and other contaminants which could affect the performance of the device from contacting the silicon wafer. In military applications where high reliability and quality is essential, silicon nitride is generally preferred. However, silicon nitride typically costs more to manufacture because additional equipment is necessary to process wafers having a layer of silicon nitride and the vapor deposition process for silicon nitride is typically slower than for silicon dioxide.

It will of course be appreciated that insulative dielectric materials other than silicon dioxide or silicon nitride could be used, so long as they are capable of being deposited onto the semiconductor substrate by means of chemical-vapor deposition, which is an important step of the process of the present invention. The importance of chemical-vapor deposition is appreciated in light of findings that the magnetic material immediately cracks and flakes off the substrate when the layer of ferromagnetic or magnetic alloy material is deposited onto a thermally grown layer of silicon dioxide.

With reference again to FIG. 1, after the layer 12 of insulated dielectric material has been deposited onto the wafer 10, the wafer 10 is next coated with a thin-film layer 14 of magnetic material. The magnetic material may comprise a thin-film layer **14*a* (see FIGS. 2 and 3**) of Permalloy (i.e., a 81-19 nickel-iron alloy) or the magnetic material may comprise other nickel-iron alloys (including nickel-iron molybdenum alloys), a manganese-bismuth, alloy, nickel-cobalt alloy, a cobalt-chromium alloy, or other suitable magnetic materials or alloys.

A magnetic material or alloy suitable for use as thin-film magnetic layer 14 in the present invention should have the following characteristics: (a) have a reasonable high magnetic permeability, (b) have the capability of being applied by sputtering, (c) result in a layer which is stable over time without flaking off, and (d) have a curie point that is sufficiently high that none of the other processing steps will affect the layer.

According to the present invention, the layer of the magnetic material is deposited onto the insulative dielectric layer by sputtering. Sputtering is accomplished by ionizing inert gas particles in an electric field so as to develop a gas plasma. A source or "target" is placed in the electric field so that it is bombarded by the ionized inert gas particles. When the target is bombarded, the energy of the ionized gas particles physically dislodges or "sputters off" atoms of the target material.

Although sputtering has been accomplished using either direct current or radio frequency power sources, in the present invention radio frequency sputtering apparatus is preferred, because in this type of apparatus the target material can either be a metal or a dielectric and because greater uniformity can be achieved in the thickness of the magnetic layer.

Figure 5:
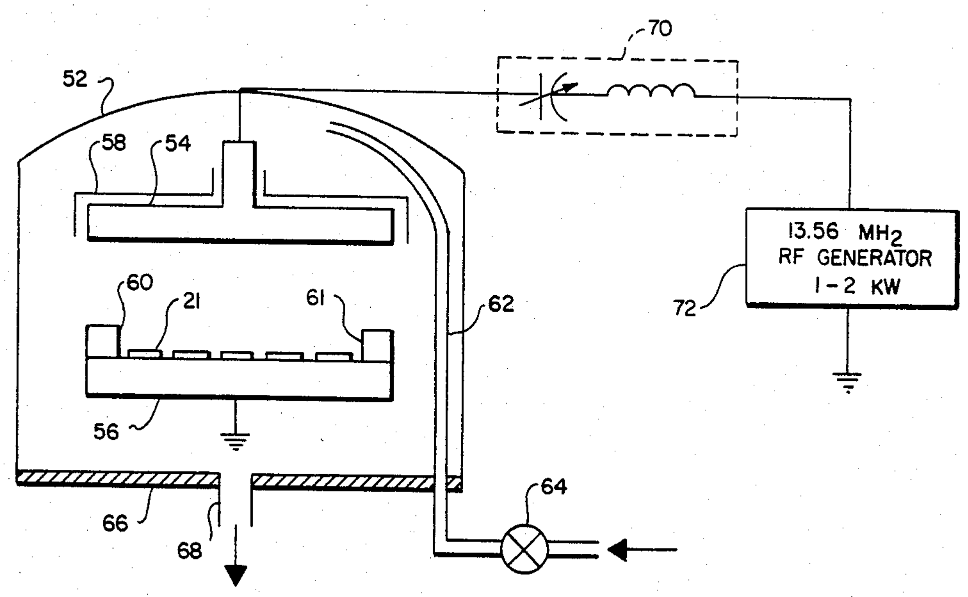
FIG. 5 is a schematic diagram of an apparatus which may be used according to the process of the present invention to sputter the magnetic material onto the insulative dielectric layer.

An example of a simple radio frequency diode sputtering apparatus which can be used in the process of the present invention is schematically illustrated in FIG. 5. The apparatus includes an RF electrode which is made from Permalloy or other suitable magnetic material that is to be sputtered onto the wafers. Electrode 54 is protected by a ground shield 58, and it is connected through an RC matching network 70 to an RF generator 72. The output of the RF generator may be, for example, in the range of 1 to 2 kilowatts at 13.56 MHz.

The target material consists of the silicon wafers 16, each of which includes the semiconductor substrate 10 (see FIG. 1) with a layer 12 of insulative dielectric material deposited onto the substrate. The wafers 16 are supported on a metal substrate holder 56 which is grounded. The electrode 54 and metal substrate holder 56 are enclosed in a glass chamber 52. The interior of the chamber is connected through a port 68 formed in the base 66 thereof to a source of vacuum (not shown). An inert gas, for example Argon, is injected into the chamber through a small tube 62 controlled by a valve 64.

In the operation of the apparatus, the glass chamber 52 is filled with the rare gas at a pressure on the order of about 10 mtorr. A sufficient potential difference is then established between the electrode 54 and metal substrate holder 56 so as to cause the gas to break down, thereby creating a glow discharge. Sputtering is due to the automatic establishment of a DC self-bias by the action of the plasma, and the apparatus is operated at a current density of 1 to 10 $mA/cm^2$.

Electrode 54 may typically be 5 to 50 cm in diameter with a 1 to 12 cm inter-electrode spacing. The rate at which the magnetic material is sputtered onto the target wafers is characterized by the equation G=CIS, where G is the deposition rate, S is the sputtering yield and C is a constant of proportionality that characterizes the particular apparatus being used. The sputtering yield S is a function of gas pressure and the practical upper limit on pressure is about 100 mtorr with deposition rates of 100 to 500 angstroms per minute.

In order to get the best signal from magnetic layer **14*b*, it is desirable that the magnetic layer be as thin as possible; however, if the layer is too thin, there may be problems in providing continuous coverage of the steps in the wafer. Hence, magnetic layer 14b may be applied to a thickness of from about 2000 Å to about 10,000 Å, with one contemplated thickness being in the range from about 4,000 Å to about 5000 Å. Using the apparatus illustrated in FIG. 5**, this layer can be applied at the rate of several hundred angstroms per minute. Using this rate, an adequate uniformity in the thickness of the layer of magnetic material can be obtained.

It has been found to be desirable to enclose the silicon wafer, the silicon dioxide layer, and magnetic layer in a coating of silicon dioxide in order to protect the resulting wafer from impurities and contaminants that might affect the induced EMF of the magnetic layer. This silicon dioxide coating should be as thin as possible but yet reliably insulate the wafer. If this silicon dioxide coating is too thick, the magnetic signal is attenuated because of the greater distance from the conductor to the magnetic layer; conversely, if the coating is too thin, pin holes or cracks in the coating can develop.

The above-described apparatus, when prepared according to the methods of the present invention, is stable over time such that the magnetic layer does not readily crack or separate from the underlying silicon dioxide layer.

Following are representative examples showing the use of the process of the present invention to manufacture a product which includes a thin-film layer of magnetic material deposited so as to completely and permanently adhere to the layer of insulated dielectric material formed on the semiconductor substrate.

EXAMPLE 1

According to the method of the present invention, a semiconductor wafer is subjected to prior art imaging, deposition and growth, and etching-masking processes so as to form the basic transistor elements for an integrated circuit. The wafer is then subjected to a chemical-vapor deposition process in order to form an insulated dielectric layer of silicon dioxide on the wafer.

The wafer is placed into a cold-wall vapor deposition apparatus as illustrated in FIG. 4, in which the wafer is heated to a temperature of approximately 400° C. After the wafer has reached this temperature, silane and oxygen in a nitrogen carrier gas are introduced at the wafer surface and allowed to react so as to vapor deposit a layer of silicon dioxide on the surface of the wafer. The deposition rate of the resultant silicon dioxide layer is about 1000 Å per minute and is allowed to grow to a depth of about 10,000 Å.

Thereafter, a thin-film layer of Permalloy is "sputtered" on top of the insulated dielectric layer of silicon dioxide. This sputtering is accomplished in the radio frequency sputtering apparatus illustrated in FIG. 5 at a current density of about 10 mA/cm$^2$. The magnetic material is applied to form a layer of about 10,000 Å.

The resultant magnetic layer of Permalloy is stable such that over time it will adhere to the underlying layer of silicon dioxide without cracking or flaking.

EXAMPLE 2

Another product within the scope of the present invention is made according to the method of Example 1, except that the layer of silicon dioxide is vapor deposited by reacting silane with carbon dioxide, in the presence of nitrogen, at a temperature of about 700° C.

The magnetic layer of Permalloy adheres to the underlying layer of silicon dioxide without cracking or flaking.

EXAMPLE 3

Another product within the scope of the present invention is made according to the method of Example 1, except that the layer of silicon dioxide is vapor deposited by reacting silicane with carbon monoxide, in a hydrogen carrier gas, at a temperature of about 700° C.

The magnetic layer of Permalloy adheres to the underlying layer of silicon dioxide without cracking or flaking.

EXAMPLE 4

Another product within the scope of the present invention is made according to the method of Example 1, except that the layer of silicon dioxide is deposited by reacting silicon chloride with carbon dioxide, in the presence of hydrogen gas, at a temperature of about 900° C.

The magnetic layer of Permalloy adheres to the underlying layer of silicon dioxide without cracking or flaking.

EXAMPLE 5

Another product within the scope of the present invention is made according to the method of Example 1, except that the layer of silicon dioxide is deposited by reacting dichlorosilane with nitrous oxide.

The magnetic layer of Permalloy adheres to the underlying layer of silicon dioxide without cracking or flaking.

EXAMPLE 6

Another product within the scope of the present invention is made according to the method of Example 1, except that a layer of silicon nitride is produced (instead of a layer of silicon dioxide) by reacting silane with ammonia, in the presence of hydrogen, at about 1000° C.

The magnetic layer of Permalloy adheres to the underlying layer of silicon nitride without cracking or flaking.

EXAMPLE 7

Another product within the scope of the present invention is made according to the method of Example 1, except that a layer of silicon nitride is produced (instead of a layer of silicon dioxide) by reacting silane with ammonia, in the presence of nitrogen, at about 700° C.

The magnetic layer of Permalloy adheres to the underlying layer of silicon nitride without cracking or flaking.

EXAMPLE 8

Another product within the scope of the present invention is made according to the method of Example 1, except that a layer of silicon nitride is produced (instead of a layer of silicon dioxide) by reacting dichlorosilane with ammonia, in the presence of hydrogen, at about 1000° C.

The magnetic layer of Permalloy adheres to the underlying layer of silicon nitride without cracking or flaking.

EXAMPLE 9

Products within the scope of the present invention are made by using the methods set forth in Examples 1 through 8, except that a thin-film layer of a manganese-bismuth alloy is sputtered onto the layer of insulated dielectric.

The resultant magnetic layer of manganese-bismuth adheres to the underlying layer of insulated dielectric without cracking or flaking.

EXAMPLE 10

Products within the scope of the present invention are made by using the methods set forth in Examples 1 through 8, except that a thin-film magnetic layer of a 75-20-5 nickel-iron-molybdenum alloy is sputtered onto the layer of insulated dielectric.

The resultant magnetic layer of nickel-iron-molybdenum alloy adheres to the underlying layer of insulated dielectric without cracking or flaking.

EXAMPLE 11

Products within the scope of the present invention are made by using the methods set forth in Examples 1 through 8, except that a thin-film magnetic layer of a nickel-cobalt alloy is sputtered onto the layer of insulated dielectric.

The resultant magnetic layer of nickel-cobalt alloy adheres to the underlying layer of insulated dielectric without cracking or flaking.

EXAMPLE 12

Products within the scope of the present invention are made by using the methods set forth in Examples 1 through 8, except that a thin-film magnetic layer of a cobalt-chromium is sputtered onto the layer of insulated dielectric.

The resultant magnetic layer of cobalt-chromium alloy adheres to the underlying layer of insulated dielectric without cracking or flaking.

From the foregoing description and examples, it is readily apparent that apparatus and methods of the present invention provide a workable process for depositing a layer of magnetic material onto an insulative dielectric layer such that the layer of magnetic material will completely and permanently adhere to the insulative dielectric layer.

The invention may be embodied in other specific forms without departing from its spirit or essential characteristics. The described embodiment is to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A process for depositing a layer of magnetic material onto a layer of insulative dielectric material, said process comprising the steps of:
   - preparing a semiconductor substrate in the form of a wafer;
   - subjecting said wafer to a chemical-vapor deposition process so as to deposit an insulative dielectric layer of silicon dioxide having a thickness of from about 8,000 angstroms to about 10,000 angstroms onto said wafer, said chemical-vapor deposition process comprising the reaction of silane and oxygen at a temperature in the range of from about 350° C. to about 500° C.; and
   - depositing a layer of magnetic material onto the insulative dielectric layer by sputtering the magnetic material onto the insulative dielectric layer such that the layer of magnetic material completely and permanently adheres to the insulative dielectric layer.

2. A process as defined in claim 1 wherein said semiconductor substrate is comprised of silicon.

3. A process as defined in claim 1 wherein said semiconductor substrate is comprised of germanium.

4. A process as defined in claim 1 wherein said chemical-vapor deposition process comprises reacting the silane and oxygen at a temperature within the range of from about 400° C. to about 410° C. so as to form the silicon dioxide layer.

5. A process as defined in claim 1 wherein said magnetic material is comprised of a nickel-iron alloy.

6. A process as defined in claim 1 wherein said magnetic material is comprised of a manganese-bismuth alloy.

7. A process as defined in claim 1 wherein said magnetic material is comprised of a nickel-cobalt alloy.

8. A process as defined in claim 1 wherein said magnetic material is comprised of a cobalt-chromium alloy.

9. A process for depositing a layer of magnetic material onto a layer of insulative dielectric material such that said layer of magnetic material will completely and permanently adhere to the insulative dielctric layer, said process comprising the steps of:
   - preparing a semiconductor substrate in the form of a wafer;
   - subjecting said wafer to a chemical-vapor deposition process so as to deposit an insulative dielectric layer of silicon dioxide having a thickness of from about 8,000 angstroms to about 10,000 angstroms onto said wafer, said chemical-vapor deposition process comprising the reaction of silane and oxygen in the presence of a nitrogen gas carrier at a temperature in the range of from about 350° C. to about 500° C.; and
   - depositing a layer of an iron-nickel alloy onto the silicon dioxide layer by sputtering the iron-nickel alloy onto the insulative dielectric layer such that the layer of magnetic material completely and permanently adheres to the insulative dielectric layer.

10. A process for manufacturing an integrated circuit which comprises a thin-film layer of magnetic material deposited onto a layer of insulative dielectric material such that said thin-film layer of magnetic material will completely and permanently adhere to said insulative dielectric layer, said process comprising the steps of:
   - preparing a silicon wafer having a plurality of individual circuit elements formed on said wafer;
   - chemically depositing an insulative dielectric layer of silicon dioxide having a thickness of from about 8,000 angstroms to about 10,000 angstroms onto said silicon wafer by heat-induced vapor deposition of silane and oxygen at a temperature in the range of from about 350° C. to about 500° C.; and
   - sputtering a thin-film layer of magnetic material onto said layer of insulative dielectric material.

11. A process as defined in claim 10 wherein said magnetic material comprises a nickel-iron alloy.

* * * * *